United States Patent
Lin et al.

(10) Patent No.: US 9,912,302 B2
(45) Date of Patent: Mar. 6, 2018

(54) PULSE DETECTION AMPLIFIER

(71) Applicant: Sensors Unlimited, Inc., Princeton, NJ (US)

(72) Inventors: Minlong Lin, Plainsboro, NJ (US); Joshua Lund, Dallas, TX (US); Robert Brubaker, Freehold, NJ (US)

(73) Assignee: SENSORS UNLIMITED, INC., Princeton, NJ (US)

( * ) Notice: Subject to any disclaimer, the term of this patent is extended or adjusted under 35 U.S.C. 154(b) by 213 days.

(21) Appl. No.: 14/869,710

(22) Filed: Sep. 29, 2015

(65) Prior Publication Data

US 2016/0211814 A1 Jul. 21, 2016

Related U.S. Application Data

(60) Provisional application No. 62/105,557, filed on Jan. 20, 2015.

(51) Int. Cl.
*H03F 3/08* (2006.01)
*G01J 1/44* (2006.01)
(Continued)

(52) U.S. Cl.
CPC .............. *H03F 3/082* (2013.01); *G01J 1/44* (2013.01); *H03F 3/08* (2013.01); *H03F 3/217* (2013.01);
(Continued)

(58) Field of Classification Search
CPC . H03F 3/082; H03F 3/08; H03F 3/217; H03F 2200/474; H03F 2200/78;
(Continued)

(56) References Cited

U.S. PATENT DOCUMENTS

| 3,786,264 | A | * | 1/1974 | Ferro | .................. | H01L 27/1443 |
| | | | | | | 250/214 R |
| 4,467,192 | A | * | 8/1984 | Velo | ........................ | G01J 1/44 |
| | | | | | | 250/214 A |

(Continued)

OTHER PUBLICATIONS

IBM Technical Disclosure Bulletin, Jan. 1982, "Transimpedance Amplifier with Improved Speed, Sensitivity, and Dynamic Range" (NN82014146).*

(Continued)

*Primary Examiner* — Que T Le
*Assistant Examiner* — Jennifer Bennett
(74) *Attorney, Agent, or Firm* — Snell & Wilmer, L.L.P.

(57) ABSTRACT

A pulse detector amplifier is disclosed. The pulse detector amplifier may have a detection switching leg that receives an input energy pulse. The pulse detector may have a mirror fast trigger including a trigger node and controlling a mirrored switching leg. The detection switching leg may trigger the trigger node in response to the input energy pulse. The pulse detector amplifier may also have a mirrored switching leg that controlled by the trigger node. The mirrored switching leg may control a voltage and/or current on the output node responsive to the input energy pulse. Thus, the pulse detector may generally include a cascode architecture, with a mirror fast trigger (which may include a FET) between the mirrored legs of the amplifier and enhancing the rapid triggering of the amplifier output. Thus the pulse detector may be power efficient, may have a small part count, and may be sensitive.

12 Claims, 3 Drawing Sheets

(51) Int. Cl.
*H03F 3/217* (2006.01)
*G01R 19/00* (2006.01)

(52) U.S. Cl.
CPC ........ *G01R 19/00* (2013.01); *H03F 2200/474* (2013.01)

(58) Field of Classification Search
CPC ........ H04N 5/3745; H04N 5/33; H04N 5/378; H01L 27/14649; G01J 1/44; G01J 1/4238; G01J 1/42; G01R 19/00
See application file for complete search history.

(56) References Cited

U.S. PATENT DOCUMENTS

| | | | | |
|---|---|---|---|---|
| 5,926,259 A | * | 7/1999 | Bamberger | ............... G01C 3/08 356/4.01 |
| 7,045,762 B2 | * | 5/2006 | Fujita | ...................... H03F 3/082 250/214 A |
| 8,969,783 B2 | * | 3/2015 | Oomori | .............. H04B 10/6911 250/214 R |
| 2003/0214688 A1 | | 11/2003 | Koseki et al. | |
| 2010/0123812 A1 | | 5/2010 | Sekiguchi et al. | |

OTHER PUBLICATIONS

Extended European Search Report dated Jun. 9, 2016 in European Application No. 16151846.9.

Dmochowski, et al., "Camera pixel for coherent detection of modulated light," Electronics Letters, IEE Stevenage, GB, vol. 40, No. 22, Oct. 28, 2004, pp. 1403-1404.

Ollivier-Henry, et al., "Design and Characteristics of a Multichannel Front-End ASIC Using Current-Mode CSA for Small-Animal PET Imaging," IEEE Transactions on Biomedical Circuits and Systems, US, vol. 5, No. 1, Feb. 2, 2011, pp. 90-99.

Communication Pursuant to Article 94(3) EPC dated Mar. 16, 2017 in European Application No. 16151846.9.

* cited by examiner

PULSE DETECTION AMPLIFIER

CROSS-REFERENCE TO RELATED APPLICATIONS

This application is a nonprovisional of, and claims priority to, and the benefit of U.S. Provisional Application No. 62/105,557, entitled "PULSE AMPLIFIER," filed on Jan. 20, 2015, which is hereby incorporated by reference in its entirety.

FIELD

The present disclosure relates generally to systems and methods for pulse detection, and more specifically to pulse detection amplifiers with low power consumption and high sensitivity.

BACKGROUND

Pulse repetition frequency ("PRF") pulse detection amplifiers are frequently used in devices that measure distance, such as laser range finders and light detection and ranging ("LIDAR") systems. Similarly, PRF laser pulse detection amplifiers may be used in automated industrial process systems, such as assembly lines and sorting gates. However, at long ranges or in adverse industrial environments, the reflected light pulses are often very weak. A PRF pulse detector amplifier may be implemented to detect the reflected light pulses and amplify a resultant electronic signal. However, many such amplifiers such as those implementing transimpedence amplifiers and/or capacitive transimpedence amplifiers are schematically complex, such as implementing operational amplifiers, which are associated with numerous sub-components, consume significant electrical power, and may provide inadequate sensitivity.

SUMMARY

The forgoing features and elements may be combined in various combinations without exclusivity, unless expressly indicated herein otherwise. These features and elements as well as the operation of the disclosed embodiments will become more apparent in light of the following description and accompanying drawings.

A pulse detector amplifier is disclosed. The pulse detector amplifier may have a mirror fast trigger including a trigger node and controlling a mirrored switching leg in response to the trigger node, and a detection switching leg configured to receive an input energy pulse and trigger the trigger node. The mirrored switching leg may be connected to an output node and may control at least one of a voltage and a current on the output node.

A pulse detection system is disclosed. The pulse detection system may include a pulse detector amplifier configured to receive an input energy pulse and control at least one of a voltage and a current on an output node in response to the input energy pulse. The pulse detection system may also include a signal processor and noise filter including a digital signal processor connected to the output node. The pulse detection system may include an output device connected to the signal processor and noise filter and performing a first action in response to the input energy pulse.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice embodiments of the disclosure, it should be understood that other embodiments may be realized and that logical changes and adaptations in design and construction may be made in accordance with this invention and the teachings herein. Thus, the detailed description herein is presented for purposes of illustration only and not limitation. The scope of the disclosure is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Furthermore, any reference to singular includes plural embodiments, and any reference to more than one component or step may include a singular embodiment or step. Surface shading lines may be used throughout the figures to denote different parts but not necessarily to denote the same or different materials.

Figure 1:
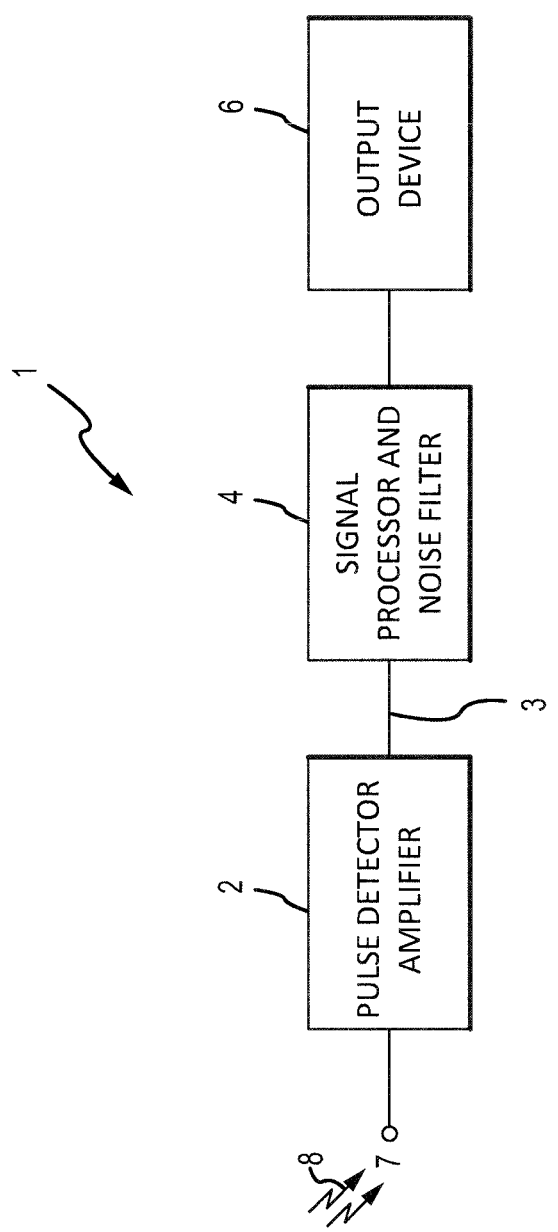
FIG. 1 illustrates a pulse detection system comprising a pulse detector amplifier according to various embodiments.

With reference to FIG. 1, a pulse detection system 1 is disclosed. A pulse detection system 1 may detect the presence and/or characteristics of an input energy pulse 8 and trigger an output device 6 in response to the presence and/or characteristics of the input energy pulse 8. For instance, a pulse detection system 1 may comprise a pulse detector amplifier 2 that receives the input energy pulse 8, and in response triggers a signal on an output node 3. The signal on the output node 3 may pass through a signal processor and noise filter 4, which reshapes the signal and provides it to an output device 6.

The input energy pulse 8 may be in form of electromagnetic radiation. For example, the input energy pulse 8 may be a light pulse. In various embodiments, the input energy pulse 8 is a collimated light pulse, such as laser light. In various embodiments, the input energy pulse 8 is a light pulse such as that created by a laser range finder, a remote sensing technology that identifies features of a target by analyzing reflected light, such as LIDAR, or any other light pulse. In further embodiments, the input energy pulse 8 is any type of electromagnetic radiation, such as gamma rays, ultraviolet light, infrared light, X rays, or any other electromagnetic radiation.

The pulse detector amplifier 2 may comprise a signal amplifier whereby the input energy pulse 8 is detected and a corresponding signal triggered on an output node 3. Various aspects of the pulse detector amplifier 2 will be discussed further herein.

The signal processor and noise filter 4 may comprise a digital signal processor. In various embodiments the signal processor and noise filter 4 may comprise analog filter components. In further embodiments, the signal processor and noise filter 4 comprises a combination of one or more digital signal processor and analog filter components.

The output device 6 may comprise any device whereby the presence and/or characteristics of the input energy pulse 8 may be displayed, or responded to, or otherwise evaluated to obtain useful data, actions, processes, or human readable displays, such as a distance measurement (e.g., a "first action"). For instance, the output device 6 may comprise a pulse repetition frequency pixel array whereby the signal on the output node 3 (as filtered by the signal processor and noise filter 4) may be combined with signals from other output nodes 3 of other pulse detector amplifiers 2 to produce a composite output in response to multiple pulse detector amplifiers 2. In this manner, a more comprehensive awareness of the input energy pulse 8 and/or multiple input energy pulses 8 may be resolved, such as in the event that the input energy pulse 8 comprises light that has somewhat de-collimated and/or comprises multiple reflections, or non-constant phase, or any other characteristics desired to be identified.

Figure 2:
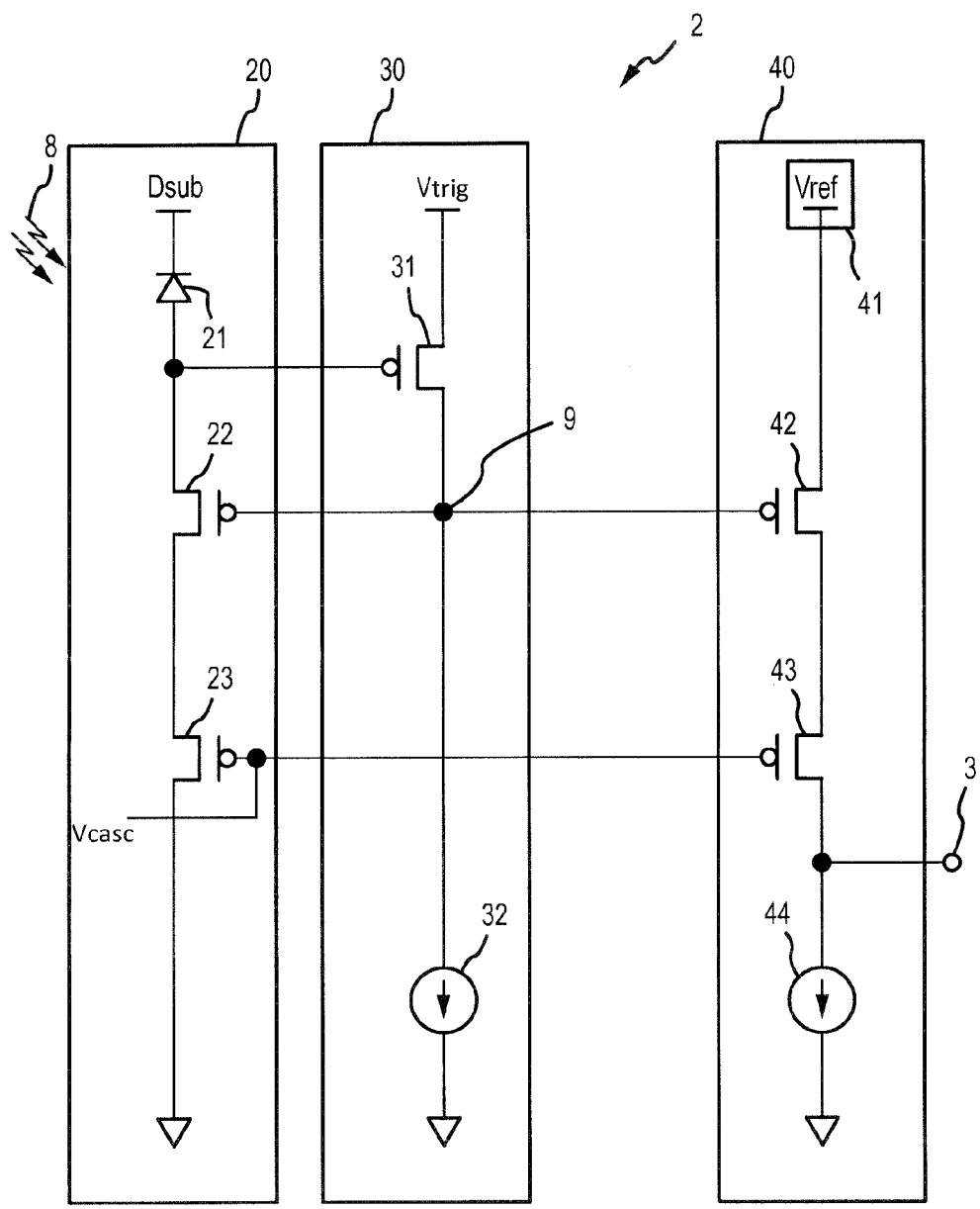
FIG. 2 illustrates a pulse detector amplifier according to various embodiments.
Figure 3:
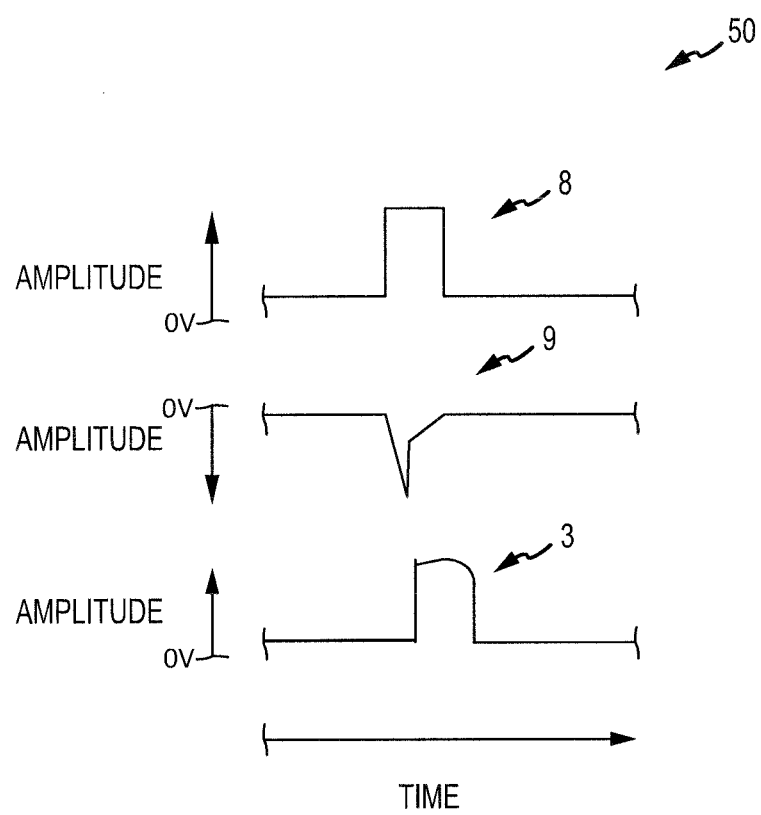
FIG. 3 illustrates example waveforms present at various nodes of a pulse detector amplifier at various times according to various embodiments.

Having discussed a pulse detection system 1, attention is now directed to FIG. 2, which illustrates various aspects of an example pulse detector amplifier 2 in greater detail and FIG. 3, which illustrates various circuit behaviors 50 of the pulse detector amplifier 2. A pulse detector amplifier 2 may comprise a regulated cascode amplifier architecture. In further embodiments, a pulse detector amplifier 2 may comprise a modified fast-trigger regulated cascode amplifier architecture disclosed herein. As such, the pulse detector amplifier 2 may comprise a detection switching leg 20, a mirror fast trigger 30, a mirrored switching leg 40, and an output node 3.

A detection switching leg 20 may receive an input energy pulse 8 and may trigger a switched electrical node in response (e.g., trigger node 9). Similarly, a mirrored switching leg 40 may monitor the triggered switched electrical node (e.g., trigger node 9) and may further trigger an output (e.g., output node 3) in response. In various embodiments, each switching leg may comprise one-half of a current mirror, which when combined in electrical communication, form a current mirror amplifier, such as a regulated cascode amplifier. Moreover, a mirror fast trigger 30 may be disposed between the detection switching leg 20 and the mirrored switching leg 40. The mirror fast trigger 30 may connect to the trigger node 9 and may enhance the response of the trigger node 9 to the input energy pulse 8, so that the mirrored switching leg 40 produces an output at the output node 3 with greater amplification and/or sensitivity and/or quicker response time than otherwise produced by a traditional regulated cascode amplifier. Thus, the pulse detector amplifier 2 may be said to comprise a modified fast-trigger regulated cascode amplifier.

A detection switching leg 20 may comprise a detector 21, an upper amplifier 22, a detection switching leg current source 23. The detection switching leg 20 may receive the input energy pulse 8 and trigger a response in the mirrored switching leg 40 in response.

A detector 21 may comprise an optical detection device. For instance, the detector 21 may comprise a light sensing diode. The light sensing diode may be reverse biased by a voltage, Dsub, and may conduct a current in response to the presence of an input energy pulse 8.

An upper amplifier 22 may comprise a voltage controlled switch. For example, the upper amplifier 22 may comprise a field-effect transistor (FET). The upper amplifier 22 may comprise a P-channel FET as illustrated in FIG. 2. However, in further embodiments, the upper amplifier 22 may comprise an N-channel FET, or may comprise any voltage controlled switch as desired. Moreover, the upper amplifier 22 may, in further embodiments, comprise a current controlled switch. For instance, the upper amplifier 22 may comprise a bipolar junction transistor (BJT). The upper amplifier 22 may comprise a PNP BJT, or may comprise a NPN BJT, or may comprise any transistor or current controlled switch as desired.

A detection switching leg current source 23 may comprise a current source. For instance, the detection switching leg current source 23 may comprise a P-channel FET as illustrated in FIG. 2 that is operated in the saturation region. However, in further embodiments, the detection switching leg current source 23 may comprise an N-channel FET, a PNP BJT or an NPN BJT or any current source as desired. Detection switching leg device 23 may comprise any voltage controlled switch (or alternately, current controlled switch) whereby various circuit characteristics such as voltage, current, gain, etc. may be adjusted such as to match with mirrored leg device 43 of mirrored switching leg 40, wherein mirrored leg device 43 substantially increases the drain impedance at output node 3 and/or establishes desired amplification properties (e.g. gain, etc.) at output node 3. In order for the P-channel FET of the detection switching leg current source 23 to approximate a current source, the detection switching leg current source 23 may comprise a P-channel FET that is operated in the saturation region. In this manner, by controlling the gate voltage of the P-channel FET, the current passing through the drain-source path of the FET may be controlled, thus also setting the voltage present at the source terminal of the FET, and as such, providing a bias voltage to the drain terminal of the upper amplifier 22 and calibrating the gate voltage of the upper amplifier 22 sufficient to trigger the upper amplifier 22 to begin/cease conduction through the drain-source path (e.g., transition between a high-impedance state and a triode state).

A mirror fast trigger 30 may comprise a trigger amplifier 31, a trigger node 9, and a trigger current source 32. The trigger amplifier 31 may comprise a P-channel FET. In further embodiments, however, the trigger amplifier 31 may comprise a N-channel FET, or a PNP BJT, or an NPN BJT, or any voltage controlled switch or any current controlled switch as desired. A trigger current source 32 may be disposed in electrical communication with the drain of the P-channel FET of the trigger amplifier 31 and a voltage supply may be disposed in electrical communication with the source of the P-channel FET, such as voltage, Vtrig. The trigger current source 32 may impel a current through the drain-source path of the trigger amplifier 31 comprising a P-channel FET. Similarly, trigger node 9 may be disposed in electrical connection with the drain of the trigger amplifier 31 comprising a P-channel FET (as well as the gate of upper amplifier 22 and mirrored amplifier 42 as discussed further herein).

In response to an input energy pulse 8 triggering current conduction through the detector 21, the mirror fast trigger 30 may, among other things, control the gate of upper amplifier 22, thus controlling the conduction of current through the upper amplifier 22 enroute to the detection switching leg current source 23. The impedance at the source terminal of upper amplifier 22 may be reduced substantially due to the negative feedback from trigger amplifer 31. The gate of trigger amplifier may be connected to the anode of the detector 21 and in parallel with the drain-source path of upper amplifier 22, connected between the source terminal of the upper amplifer 22 and the anode of detector 21. As such, the voltage variation at the source terminal of upper amplifier 22 may be substantially minimized at the input of energy pulse 8. As such, the voltage measured at trigger node 9 may be compelled to vary significantly to accommodate the large variation of photo-current from photodiode 21. As such, trigger node 9 is pulled to a low voltage state very rapidly, which similarly pulls the gate of upper amplifier 22 low, causing the upper amplifier 22 to turn on more fully. Notably, the gate voltage of trigger amplifier 31 is relatively stable due to negative feedback whereas the voltage variation at trigger node 9 is relatively significant. As such, it is apparent that in response to input energy pulse 8 (see FIG. 3), trigger node 9 first goes to a low voltage state, and then returns to a higher voltage state (see FIG. 3).

The current disclosure, among other features, discloses the disposition of a mirror fast trigger 30 having a trigger amplifier 31 disposed as described, thereby enhancing the triggering of the trigger node 9.

The pulse detector amplifier 2 further comprises a mirrored switching leg 40. In response to the various behavior of trigger node 9, the mirrored switching leg 40 operates as a voltage amplifier, producing a much greater amplitude voltage differential at output node 3, than presented at trigger node 9 as compared when in input energy pulse 8 is present, and when an input energy pulse 8 is not present. Thus, the pulse detector amplifier 2 amplifies the input energy pulse 8, and produces a greater amplitude pulse at output node 3 in response (see FIG. 3).

The mirrored switching leg 40 may comprise a reference voltage source 41, a mirrored amplifier 42, a mirrored current source 43, and an output node current source 44.

A mirrored amplifier 42 may comprise a voltage controlled switch. For example, the mirrored amplifier 42 may comprise a field-effect transistor (FET). The mirrored amplifier 42 may comprise a P-channel FET as illustrated in FIG. 2. However, in further embodiments, the upper amplifier 22 may comprise an N-channel FET, or may comprise any voltage controlled switch as desired. Moreover, the mirrored amplifier 42 may, in further embodiments, comprise a current controlled switch. For instance, the mirrored amplifier 42 may comprise a bipolar junction transistor (BJT). The mirrored amplifier 42 may comprise a PNP BJT, or may comprise a NPN BJT, or may comprise any transistor or current controlled switch as desired. Mirrored amplifier 42 may be controlled by the voltage present at trigger node 9.

A reference voltage source 41 may comprise a voltage source that may be controllable to provide an output voltage, Vref, to the source terminal of mirrored amplifier 42. Vref may be varied and may be set so that a mirrored amplifier 42 is almost-on until such time as a trigger node 9 triggers the mirrored amplifier 42 to be fully on. As used herein, "fully on" means to achieve an intended, nominal conductivity. In other words, for the voltage drop across the input and output nodes of the device that is being turned "fully on", such as a drain-source path, to reach a minimum. Thus, the reference voltage source 41 may be said to comprise a dynamic voltage source. In this manner, a mirrored amplifier 42 may be configured to respond to slight variations in the trigger node 9 voltage. Accordingly, the reference voltage source 41 may be controlled such that the threshold input energy pulse 8 amplitude necessary to trigger a response at output node 3 is set in response (e.g., the "sensitivity" of the pulse detector amplifier 2 may be set).

A mirrored current source 43 may be disposed in electrical communication with the drain of the P-channel FET of the mirrored amplifier 42. The mirrored current source 43 may impel a current through the drain-source path of the mirrored amplifier 42 comprising a P-channel FET as it turns on and off in response to trigger node 9.

A mirrored current source 43 may comprise a current source. For instance, the mirrored current source 43 may comprise a P-channel FET as illustrated in FIG. 2 that is operated in the saturation region. However, in further embodiments, the mirrored current source 43 may comprise an N-channel FET, a PNP BJT or an NPN BJT or any current source as desired. The mirrored leg device 43 may comprise any voltage controlled switch (or alternatively, current controlled switch) whereby various circuit characteristics such as voltage, current, gain, etc may be adjusted as desired at output node 3, such as substantially increasing the drain impedance at output node 3 and/or establishing desired amplification properties (e.g., gain, etc.) at output node 3. In order for the P-channel FET of the mirrored current source 43 to approximate a current source, the mirrored current source 43 may comprise a P-channel FET that is operated in the saturation region. In this manner, by controlling the gate voltage of the P-channel FET, the current passing through the drain-source path of the FET may be controlled. Thus, also setting the voltage present at the source terminal of the FET, and as such, providing a bias current to the drain terminal of the mirrored amplifier 42 and calibrating the gate voltage of the upper amplifier 42, that is sufficient to trigger the mirrored amplifier 42 to being/cease conduction through the drain-source path (e.g., transition between a high-impedance and a triode state). In various embodiments, the mirrored current source 43 may increases the impedance at output node 3 and further amplify the voltage variation at trigger 9 when mirrored amplifier 42 is substantially fully conductive.

Finally, an output node current source 44 may source/sink a current from output node 3. In response to the behavior of mirrored current source 43 and mirrored amplifier 42, however, a portion of the current may be provided via a reference voltage source 41 (e.g., through the mirrored current source 43). In this manner, the current sourced/sunk from output node 3 (and similarly the voltage present at the output node 3 relative to the common circuit ground (see FIG. 2)) may vary in response to the various status of the mirrored current source 43 and the mirrored amplifier 42, thus the output node 3 provides a signal that varies in response to the input energy pulse 8.

In response to a trigger node 9, the gate of the mirrored amplifier 42 may be controlled, thus controlling the conduction of current through the mirrored amplifier 42 enroute to the mirrored current source 43. As such, when trigger node 9 is pulled to a low voltage state very rapidly, the gate of mirrored amplifier 42 is similarly pulled low very rapidly, causing the mirrored amplifier 42 to turn on, and conduct through its drain-source path. Depending on the saturation current of the mirrored current source 43, as set in response to V-cascode, the gain of the resulting current (and thus voltage) flowing through output node 3 may be set. In general, because reference voltage source 41 is set so that mirrored amplifier 42 is almost on (e.g., conductive through the drain-source path), but not quite conductive until such time as trigger node 9 controls the gate of the mirrored amplifier 42, the initial triggering sensitivity of the pulse detector amplifier 2 to input energy pulses 8 may also be set. As such, a pulse detector amplifier 2 may have a configurable gain and a configurable initial triggering sensitivity (e.g., threshold input energy pulse 8 amplitude to impel a response at output node 3). Once the pulse detector amplifier 2 is triggered, however, the gain of the amplifier may be set according to V-cascode.

In various embodiments, a pulse detector amplifier 2 as discussed may consume less than 50 nA of current during operation and may possess a near instantaneous response speed (e.g., <1 microsecond). Embodiments may be responsive to input energy pulses 8 having a magnitude less than 500 e⁻. As such, such pulse detector amplifiers may provide high sensitivity, low power consumption, and minimal component count. For instance, as disclosed herein, a pulse detector amplifier 2 may comprise five transistors, such as P-channel FETs.

Various benefits and advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A pulse detector amplifier comprising:
   a mirror fast trigger comprising a trigger amplifier, a trigger current source, and a trigger node;
   a detection switching leg comprising a detector, an upper amplifier connected in series with the detector, and a detection switching leg current source connected in series with the detector and the upper amplifier and configured to receive an input energy pulse and trigger the trigger node; and
   a mirrored switching leg comprising a reference voltage source, a mirrored amplifier, and mirrored current source connected to an output node and controlling at least one of a voltage or a current on the output node, wherein the mirrored switching leg monitors and amplifies a trigger node current.

2. The pulse detector amplifier of claim 1, the input energy pulse comprising collimated light.

3. The pulse detector amplifier according to claim 1, wherein the detector comprises a reverse biased light sensitive diode comprising an anode and a cathode.

4. The pulse detector amplifier according to claim 3,
   wherein the upper amplifier comprises a P-channel FET comprising a gate, a drain, and a source,
   wherein the drain is connected to the detection switching leg current source,
   wherein the source is connected to the anode of the reverse biased light sensitive diode, and
   wherein the gate is connected to the trigger node.

5. The pulse detector amplifier according to claim 4, wherein the detection switching leg current source comprises a p-channel FET operated in a saturation region.

6. The pulse detector amplifier according to claim 3, the mirror fast trigger comprising:
   the trigger amplifier comprising a FET comprising a gate, a source, and a drain,
   wherein the gate is connected to the anode of the detector,
   wherein the drain is connected to the trigger node,
   wherein the source is connected to a voltage supply, and
   wherein the drain is selectively connectable to the source in response to the detector comprising the reverse biased light sensitive diode detecting the input energy pulse, whereby the trigger node is triggered.

7. The pulse detector amplifier according to claim 1,
   wherein the mirrored amplifier comprises a P-channel FET comprising a gate, a drain, and a source,
   wherein the source is connected to the reference voltage source,
   wherein the drain is connected to the mirrored current source, and
   wherein the gate is connected to the trigger node.

8. The pulse detector amplifier according to claim 7, wherein the mirrored current source comprises a P-channel FET operated in a saturation region.

9. The pulse detector amplifier according to claim 7, wherein the reference voltage source comprises a dynamic voltage source.

10. A pulse detection system comprising:
- a pulse detector amplifier configured to receive an input energy pulse and control at least one of a voltage and a current on an output node in response to the input energy pulse;
- a signal processor and noise filter comprising a digital signal processor connected to the output node; and
- an output device connected to the signal processor and noise filter and performing a first action in response to the input energy pulse,
- wherein the pulse detector amplifier comprises a detection switching leg comprising a detector, an upper amplifier connected in series with the detector, and a detection switching leg current source connected in series with the detector and the upper amplifier and configured to receive an input energy pulse and trigger the trigger node;
- a mirror fast trigger comprising a trigger amplifier, a trigger current source, and a trigger node connected to the trigger node; and
- a mirrored switching leg comprising a reference voltage source, a mirrored amplifier, and mirrored current source connected to the output node and controlling the least one of a voltage or a current on the output node, wherein the mirrored switching leg monitors and amplifies a trigger node current.

11. The pulse detection system according to claim 10, wherein the first action comprises providing a user-readable alert.

12. The pulse detection system according to claim 10, wherein the pulse detector amplifier comprises a modified fast-trigger regulated cascode amplifier.

* * * * *